(12) United States Patent
Hansen et al.

(10) Patent No.: US 7,346,113 B2
(45) Date of Patent: Mar. 18, 2008

(54) METHOD AND CIRCUIT FOR STOP OF SIGNALS QUANTIZED USING NOISE-SHAPING

(75) Inventors: Thomas H. Hansen, Værløse (DK); Lars Risbo, Copenhagen Ø (DK)

(73) Assignee: Texas Instruments Incorporated, Dallas, TX (US)

( * ) Notice: Subject to any disclaimer, the term of this patent is extended or adjusted under 35 U.S.C. 154(b) by 713 days.

(21) Appl. No.: 10/206,750

(22) Filed: Jul. 26, 2002

(65) Prior Publication Data

US 2004/0017854 A1    Jan. 29, 2004

(51) Int. Cl.
*H04B 14/04* (2006.01)
*H04L 23/00* (2006.01)

(52) U.S. Cl. .................... 375/243; 375/377
(58) Field of Classification Search ............ 375/243, 375/222, 254, 377; 341/144, 143, 131, 126, 341/137, 155; 327/551
See application file for complete search history.

(56) References Cited

U.S. PATENT DOCUMENTS

| | | | |
|---|---|---|---|
| 2,829,323 A * | 4/1958 | Steele ...................... 318/600 |
| 5,019,819 A * | 5/1991 | Kimura ...................... 341/143 |
| 5,648,778 A * | 7/1997 | Linz et al. .................. 341/110 |
| 5,697,374 A * | 12/1997 | Odagiri et al. ............. 600/500 |
| 5,760,722 A * | 6/1998 | Harris et al. ................ 341/143 |
| 6,289,508 B1 * | 9/2001 | Erickson et al. ............ 717/153 |
| 6,304,200 B1 * | 10/2001 | Masuda ...................... 341/144 |
| 6,362,765 B2 * | 3/2002 | Masuda ...................... 341/144 |
| 6,404,369 B1 * | 6/2002 | Sheen ........................ 341/143 |
| 6,532,256 B2 * | 3/2003 | Miller ....................... 375/222 |
| 6,556,158 B2 * | 4/2003 | Steensgaard-Madsen .... 341/131 |
| 6,950,049 B2 * | 9/2005 | Brooks et al. ............. 341/143 |
| 7,058,136 B1 * | 6/2006 | Hellberg et al. ........... 375/295 |
| 2002/0018012 A1 * | 2/2002 | Nakao et al. ............... 341/143 |

FOREIGN PATENT DOCUMENTS

JP          04115722 A  *  4/1992

* cited by examiner

*Primary Examiner*—Betsy L. Deppe
(74) *Attorney, Agent, or Firm*—Wade J. Brady, III; Frederick J. Telecky, Jr.

(57) ABSTRACT

A system and method are provided for stopping a quantized signal from a noise-shaper with a significantly reduced inband transient, compared to a traditional random stop of a noise-shaped signal. The noise-shaped signal is stopped at a favorable time controlled by a detector that monitors the noise-shaped signal. The detector indicates the occurrence of a good time to stop the noise-shaper such that the transient due to the stop is minimized in a fashion that substantially reduces the inband disturbance.

6 Claims, 13 Drawing Sheets

FFRE OF INBAND
FILTER Einf(n)

FFRE OF INBOUND FILTER E(n)

FFRE OF INBOUND FILTER E(n)

METHOD AND CIRCUIT FOR STOP OF SIGNALS QUANTIZED USING NOISE-SHAPING

BACKGROUND OF THE INVENTION

1. Field of the Invention

This invention relates to a method and circuit for stopping signals quantized using noise-shaping.

2. Description of the Prior Art

A common problem related to systems using noise-shaping concerns how to stop a noise-shaped signal without producing a disturbing inband transient. It would therefore, be advantageous and desirable to provide a circuit and method that can stop a noise-shaped signal with a minimum of inband noise related to the transition.

SUMMARY OF THE INVENTION

The present invention is directed to a circuit and method for stopping a noise-shaped signal with a minimum of inband noise related to the transition. When the noise-shaper is running (with a zero input signal), the quantized output signal f(n) consists of a finite number of discrete amplitude levels forming a signal with an inband signal content which is ideally zero. Stopping the noise-shaper, by forcing the output signal f(n) to zero, typically causes a significant inband transient which degrades the inband system performance.

More specifically, a circuit and method are provided for stopping a quantized signal from a noise-shaper with a significantly reduced inband transient, compared to a traditional random stop of a noise-shaped signal (i.e. forcing f(n) to zero at an arbitrary time instant). The noise-shaped signal is stopped at a favorable time controlled by a detector that indicates the occurrence of a good time to stop the noise-shaper such that the transient is minimized in a fashion that substantially reduces the inband disturbance.

According to one aspect, a noise-shaper stop detector is simple to implement in digital hardware containing the noise-shaper.

According to another aspect, a noise-shaper stop detector is provided having only negligible added production cost when implemented in digital hardware.

According to one embodiment a method of stopping transmission of a quantized signal from a noise-shaper comprises the steps of: feeding the quantized signal to a detector filter;

monitoring a Boolean function B(x(k)) of the state variables x(k) of the detector filter; and stopping transmission of the quantized output signal only at a time where the Boolean function is true such that a switching transient occurring when the quantized output signal transmission is stopped, is minimized to substantially reduce inband disturbance.

According to another embodiment, a system for stopping a quantized signal from a noise-shaper comprises: a filter fed by a quantized signal from a noise-shaper; a circuit configured to generate a Boolean output signal in response to the state variables of the filter; at least one combinatorial element configured to generate a stop signal in response to the Boolean output signal; and a switch configured to turn the noise-shaped signal on and off in response to the stop signal.

According to yet another embodiment, a system for generating a noise-shaper stop signal comprises: a filter fed by a quantized signal from a noise-shaper; a circuit configured to generate a Boolean output signal in response to the state variables of the filter; and a control logic circuit configured to generate a stop signal in response to a desired sample number associated with the Boolean output signal.

BRIEF DESCRIPTION OF THE DRAWINGS

Other aspects, features and many of the attendant advantages of the present invention will be readily appreciated as the invention become better understood by reference to the following detailed description when considered in connection with the accompanying drawings in which like reference numerals designate like parts throughout the figures thereof and wherein:

FIG. 24(*b*) is a block diagram illustrating a simplified topology for implementing the detector shown in FIG. 24(*a*);

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Methods for stopping a noise-shaped signal with a minimum of inband noise related to the transition are discussed herein below with reference to FIGS. 1-27. A Noise-Shaper is generally a quantizing element embedded in a feedback loop with a suitable loop filter. The loop filter can be designed to suppress quantization noise of the quantizing element in a particular frequency band (hereafter called the in-band). The spectral shaping function of the quantization noise is often called the Noise Transfer Function (NTF). Noise Shapers are also referred to as Sigma-Delta or Delta-Sigma modulators. When the noise-shaped signal f(n) is active, it is consisting of a finite number of discrete amplitude levels forming a signal with an inband signal content which is ideally zero. The loop filter keeps track of quantization errors introduced at earlier sampling times and corrects for these errors at future output samples. When the noise-shaped signal f(n) is stopped, it is set to zero.

Figure 1:
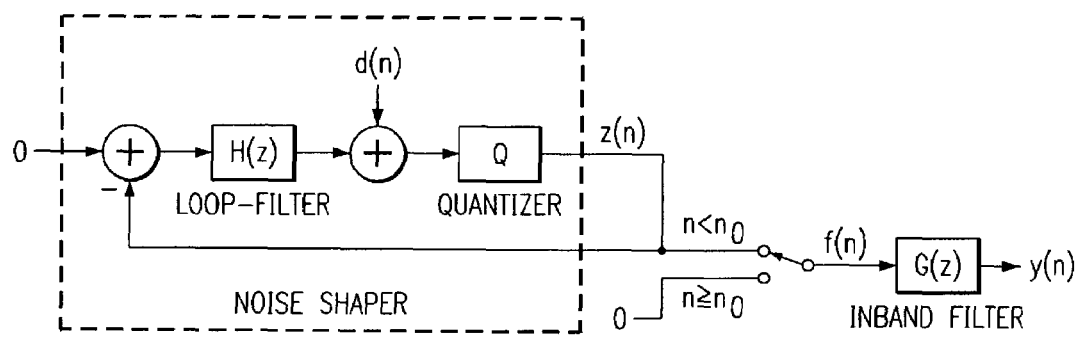
FIG. 1 is a block diagram illustrating the transition from a noise-shaped zero z(n) to a zero signal.

FIG. 1 is a block diagram illustrating the transition from a noise-shaped zero z(n) to a zero signal. The Noise Shaper with output signal z(n) has a quantizer Q and a loop filter H(z). The signal d(n) is a dither signal to help randomizing the quantization noise. The signal f(n) is the resulting output signal given by $$f(n) = \begin{cases} z(n), & n < n_0 \\ 0, & n \geq n_0 \end{cases} \quad (1)$$

When the output signal f(n) is forced to zero, the loop filter can no longer correct for past quantization errors by using corrections to future samples. This gives generally an in-band transient error if the Noise Shaper is stopped at an arbitrary time instant due to the lack of correction when the output is forced to zero.

Example 1 below now describes a method and results of implementing a traditional noise-shaper stop (ie. at an arbitrary time) using the topology shown in FIG. 1.

EXAMPLE 1

Traditional Noise-Shaper Stop

Figure 2:
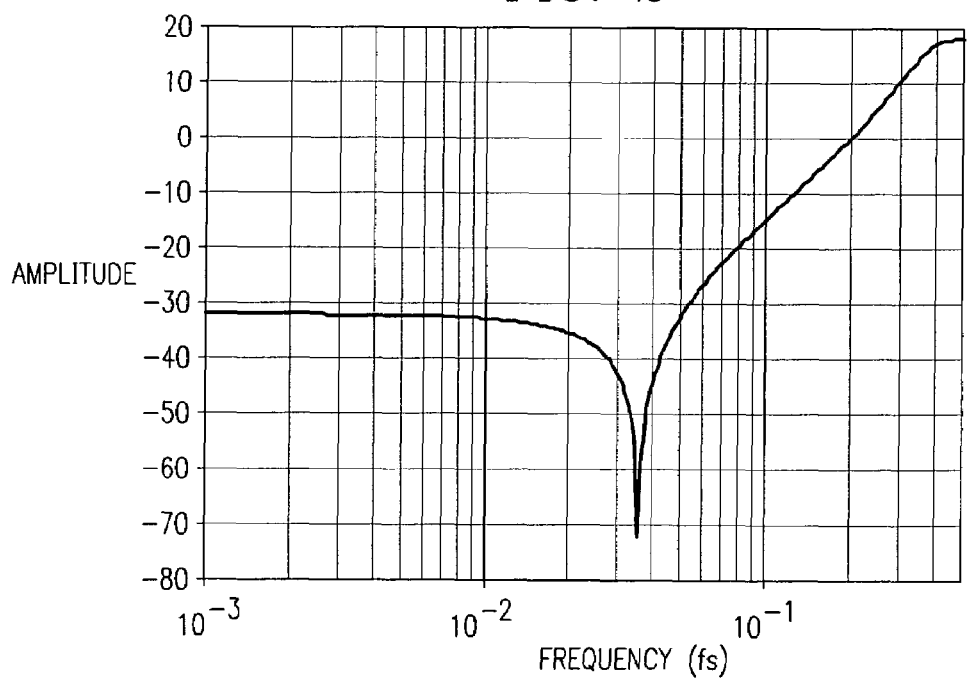
FIG. 2 is a plot diagram illustrating the amplitude of the noise transfer function (NTF) for a $2^{nd}$ order noise-shaper using the topology shown in FIG. 1.

A $2^{nd}$ order noise-shaper is made using the topology shown in FIG. 1. The amplitude of the noise transfer function (NTF) is shown in FIG. 2. The dither signal d(n) is white noise with a triangular probability density function in the interval [−1;1]; and the quantization step size in the quantizer is 1.

Figure 3:
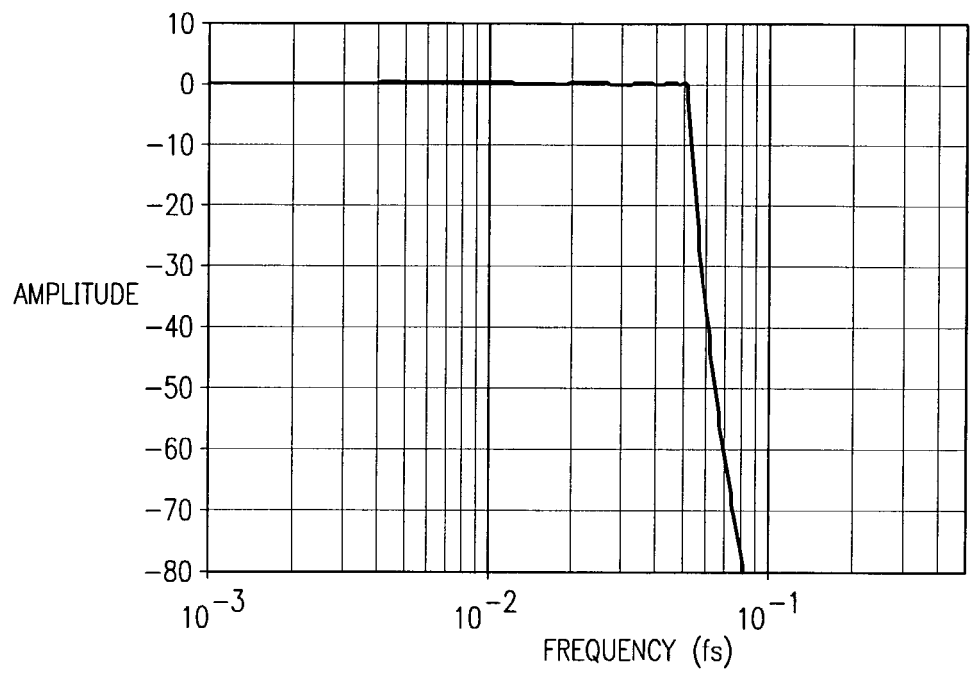
FIG. 3 is a plot diagram illustrating the amplitude characteristic of the inband filter G(z) shown in FIG. 1 for a $10^{th}$ order Chebyshev filter having a cutoff frequency of ½0 of the sampling frequency fs.
Figure 6:
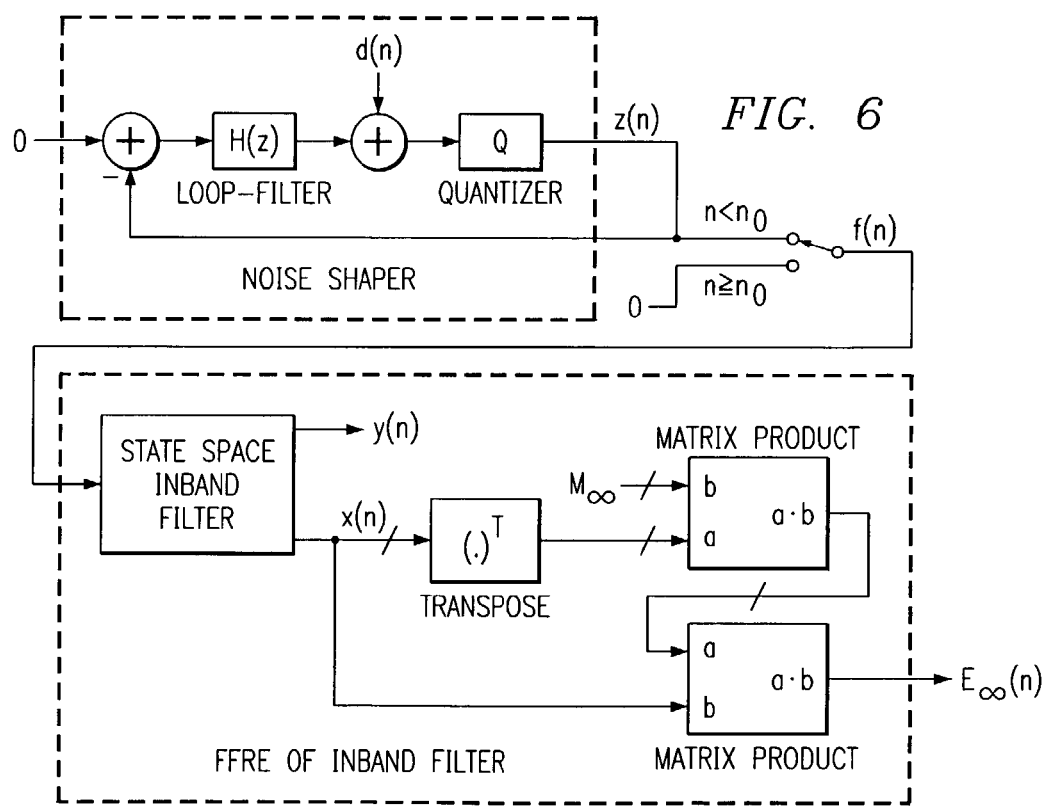
FIG. 6 is a block diagram showing a Future Filter Response Energy (FFRE) calculation on the noise-shaped signal f(n)

FIG. 3 is a plot diagram illustrating the amplitude characteristic of the inband filter G(z) shown in FIG. 1 for a $10^{th}$ order Chebyshev filter having a cutoff frequency of ½₀ of the sampling frequency fs.

Figure 4:
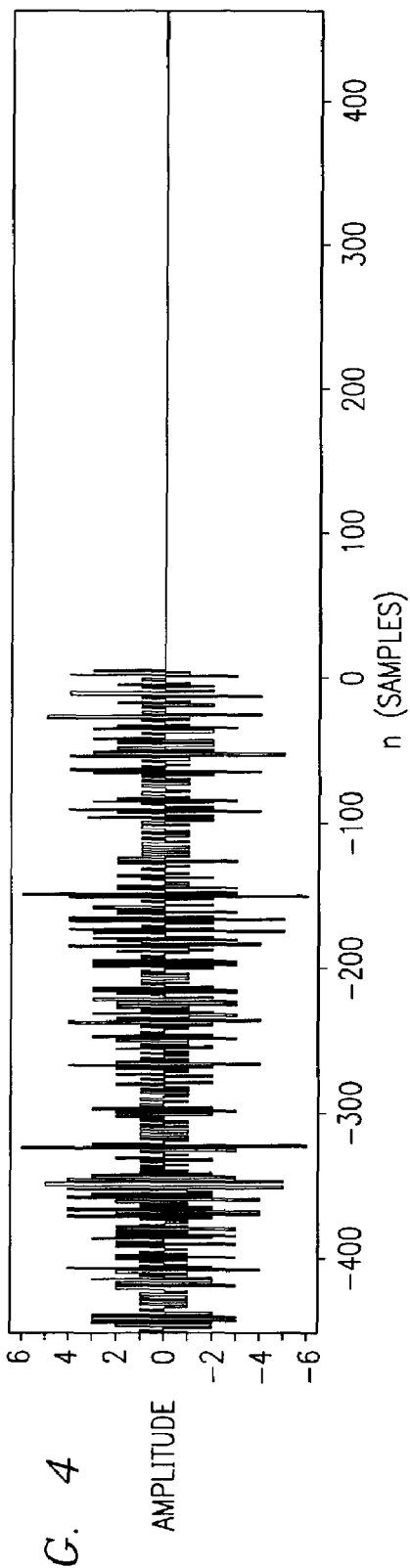
FIG. 4 is a waveform diagram illustrating the noise-shaped signal f(n) shown in FIG. 1.

FIG. 4 is a waveform diagram illustrating the quantized output signal f(n) shown in FIG. 1 for $n_0=0$.

Figure 5:
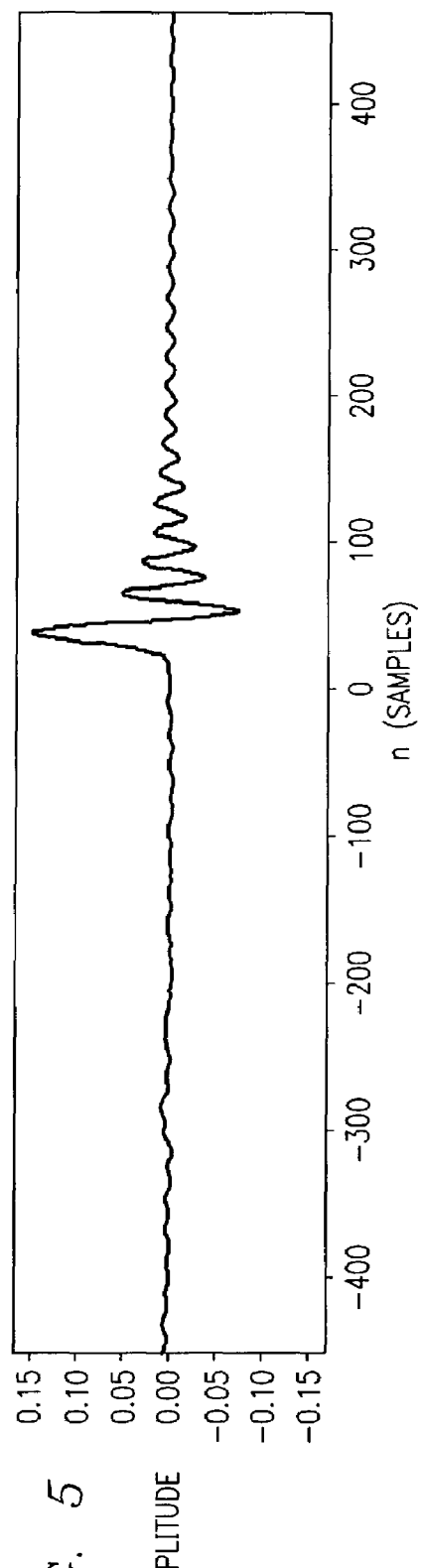
FIG. 5 is a waveform diagram illustrating the signal y(n), that is an inband filtered version of the noise-shaped signal f(n) shown in FIG. 1, corresponding to the waveform diagram of f(n) shown in FIG. 4.

FIG. 5 is a waveform diagram illustrating the signal y(n), that is an inband filtered version of the quantized output signal f(n). A significant transient can be seen at $n=n_0=0$ due to the stop of the noise-shaped zero. The noise before $n=n_0=0$ is the spectrally shaped noise from the quantization.

Future Filter Response Energy

A future filter response energy (FFRE) can be calculated, given a zero future filter input and the present filter state. To do this the in-band filter is defined in state-space. Any linear filter can be defined in state-space representation by the equations $$x(n+1)=Ax(n)+bf(n)$$

$$y(n)=c^T x(n)+df(n) \quad (2)$$

where x(n) is a column vector of the filter states, A is a square matrix, b and c are column vectors and d is a constant. The f(n) term is the filter input and the y(n) term is the filter output. A, b, c and d define the filter transfer function; and any filter can be represented in this state-space form. The $^T$ symbol denotes the transpose operation. Given a filter input at zero (f(n)=0), and using the foregoing definitions, it can be shown that $$x(n+k)=A^k x(n), k \geq 0 \quad (3)$$

$$y(n+k)=c^T x(n+k) \Leftrightarrow$$

$$y(n+k)=c^T A^k x(n), k \geq 0 \quad (4)$$

The energy $E_N(n)$ of the filter transient in the time-window from n to n+N (normalized by the sampling period) is given by $$E_N(n) = \sum_{k=0}^{N} y(n+k)^2 = \sum_{k=0}^{N} c^T A^k x(n) c^T A^k x(n) \Leftrightarrow \quad (5)$$

$$E_N(n) = \sum_{k=0}^{N} x(n)^T (A^k)^T c c^T A^k x(n) \Leftrightarrow$$

$$E_N(n) = x(n)^T M_N x(n)$$

where (6)

$$M_N = \left[ \sum_{k=0}^{N} (A^k)^T c c^T A^k \right]$$

is a constant matrix given by the filter parameters. Then $$M_N = (A^0)^T c c^T A^0 + (A^1)^T c c^T A^1 + \ldots + (A^N)^T c c^T A^N \Leftrightarrow \quad (7)$$
$$A^T M_N A = (A^1)^T c c^T A^1 + (A^2)^T c c^T A^2 + \ldots + (A^{N+1})^T c c^T A^{N+1}$$

Subtraction of the two equations gives $$M_N - A^T M_N A = c c^T - (A^{N+1})^T c c^T A^{N+1} \Leftrightarrow \quad (8)$$
$$vec(M_N) - vec(A^T M_N A) = vec\left(c c^T - (A^{N+1})^T c c^T A^{N+1}\right) \Leftrightarrow$$
$$vec(M_N) - (A^T \otimes A^T) vec(M_N) = vec\left(c c^T - (A^{N+1})^T c c^T A^{N+1}\right) \Leftrightarrow$$
$$M_N = vec^{-1}\left[(I - A^T \otimes A^T)^{-1} vec\left(c c^T - (A^{N+1})^T c c^T A^{N+1}\right)\right]$$

The $\otimes$ operator is the Kronecker product and the vec function converts a matrix to a column vector by stacking the columns of the matrix. The $vec^{-1}$ function is the inverse function of the vec function in the sense that $vec^{-1}(vec(X)) = X$, e.g. the $vec^{-1}$ function forms a matrix from a vector. Stable filters have the property that, $$\lim_{N \to \infty} (A^N) \to \underline{0} \quad (9)$$

The limit value of the sum in equation (6) forming $M_N$ can consequently be found for $N \to \infty$ if the filter is stable, which gives $$M_\infty = \lim_{N \to \infty} (M_N) = vec^{-1}\left((I - A^T \otimes A^T)^{-1} vec(c c^T)\right) \quad (10)$$

Example 2 below describes one method for calculating the future inband transient energy $E_\infty(n)$ for each sample time, assuming that the future filter input f(n) is zero.

EXAMPLE 2

Future Inband Trancient Enegry Calculation

In the present example is used the same noise-shaper and inband filter characteristic as in Example 1. Also here we have $n_0=0$. The FFRE of the inband filter $E_\infty(n)$ can be calculated for each sample, assuming that the future filter input is zero—if the noise-shaped signal is stopped.

The FFRE calculation for the inband filter is done using equation (5), where the constant matrix $M_N=M_\infty$ is found from (10) using the inband filter state-space representation. At FIG. 6, the FFRE calculation is shown in block diagram form corresponding to equation (5).

Figure 7:
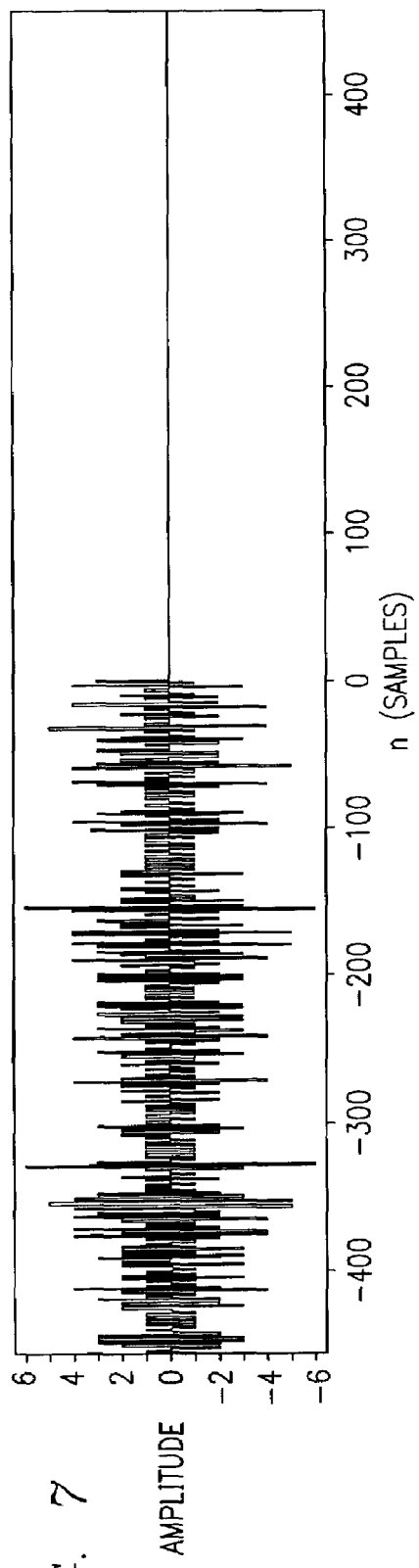
FIG. 7 is a waveform diagram illustrating the noise-shaped signal f(n) shown in FIG. 6.
Figure 8:
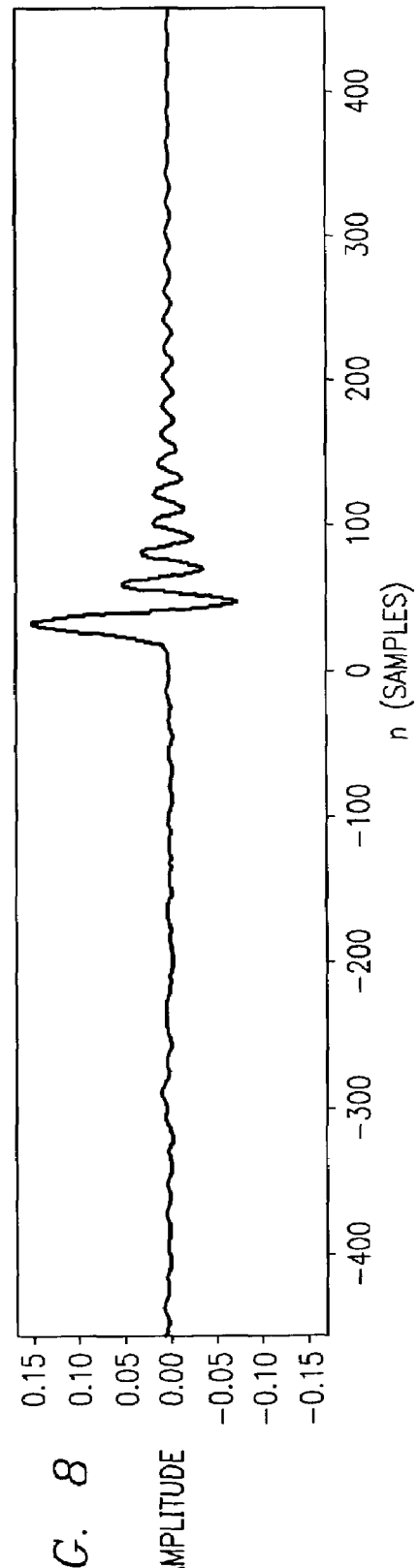
FIG. 8 is a waveform diagram illustrating the inband filtered content y(n) of the noise-shaped signal f(n) shown in FIG. 6.
Figure 9:
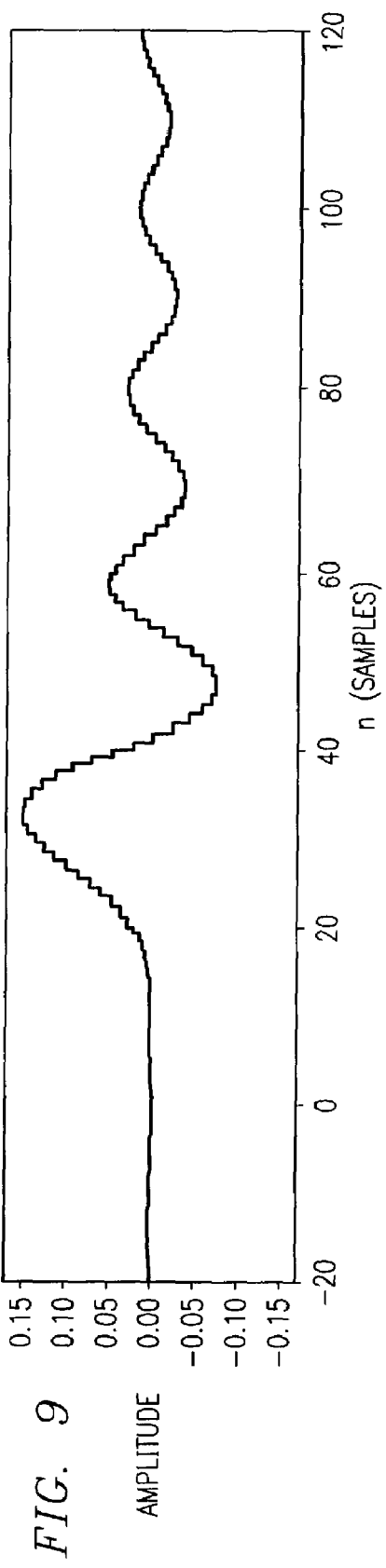
FIG. 9 is a zoomed in view of the waveform for y(n) shown in FIG. 8.
Figure 10:
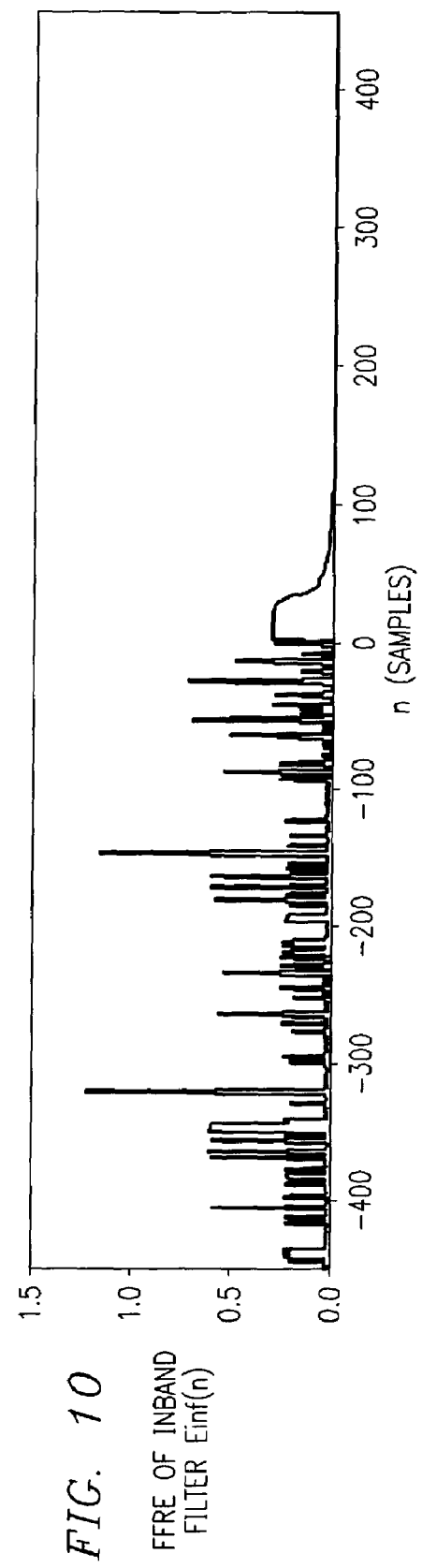
FIG. 10 is a waveform diagram illustrating the FFRE of the inband filter $E_\infty(n)$ (normalized by the sampling period) of the noise-shaped signal f(n) shown in FIG. 6, assuming that f(n) is zero for future samples.
Figure 11:
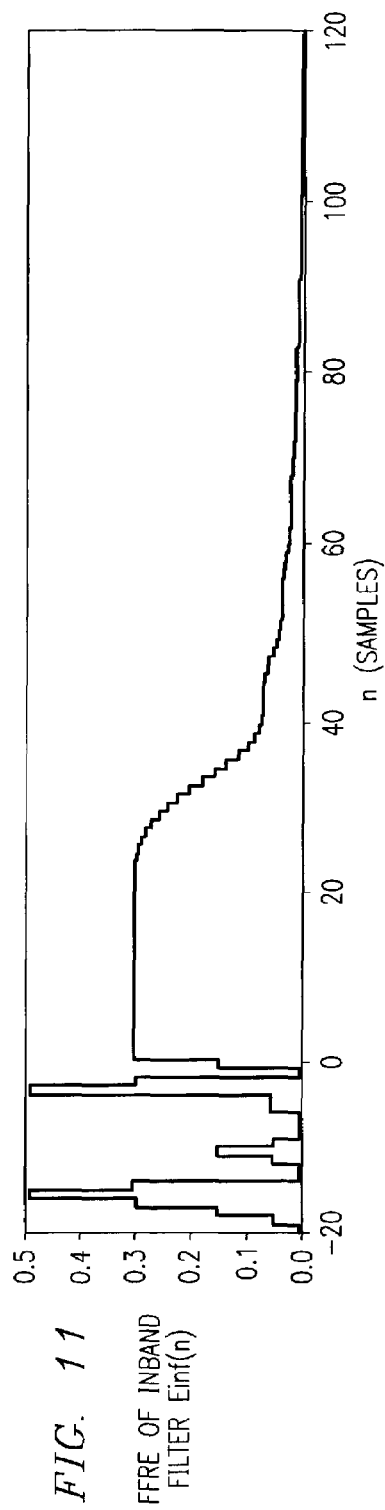
FIG. 11 is a zoomed in view of the waveform diagram illustrating the FFRE of the inband filter $E_\infty(n)$ shown in FIG. 10.

Now running the system, stopping the noise-shaped signal at $n_0=0$ gives the quantized output signal f(n) shown in FIG. 7, which has an inband filtered content y(n) as shown in FIG. 8 and FIG. 9 as seen before in Example 1. The FFRE of the inband filter $E_\infty(n)$, of the quantized output signal is shown in FIG. 10 and FIG. 11.

Figure 12:
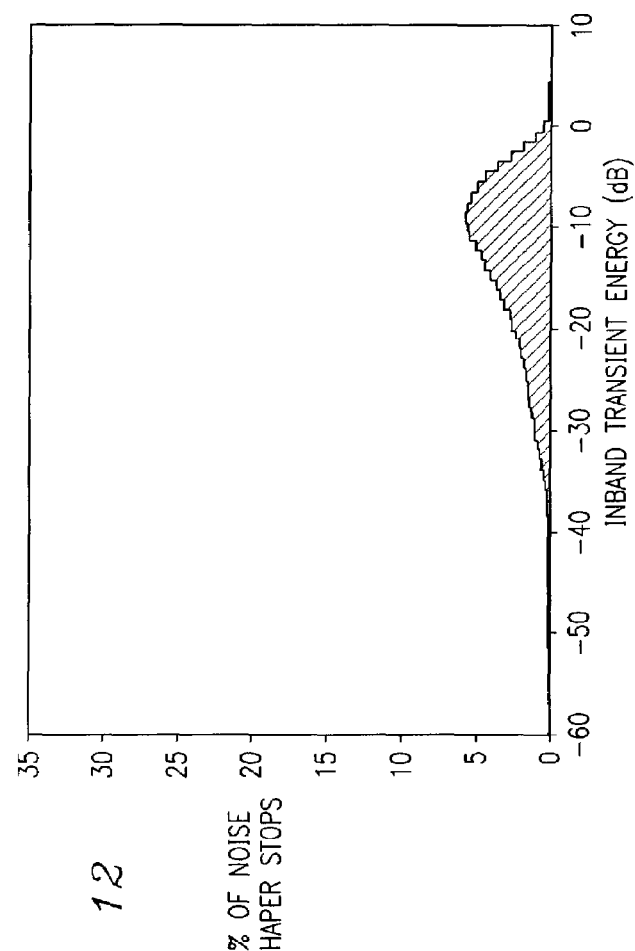
FIG. 12 is a histogram illustrating the distribution of the inband transient energy of f(n) associated with random stops of the noise-shaped signal based on a dataset corresponding to $4 \cdot 10^6$ stops.

The distribution of the FFRE is given by the noise-shaper characteristic and the inband filter. In FIG. 12 is shown a distribution, corresponding to the FFRE of the inband filter in $4 \cdot 10^6$ random noise-shaper stops using the system at FIG. 6. The mean value of the future inband filter response energy for this system (before mapping to the dB scale) is −8.9 dB.

Stop of Noise-Shaped Signal Controlled by Detector

Figure 13:
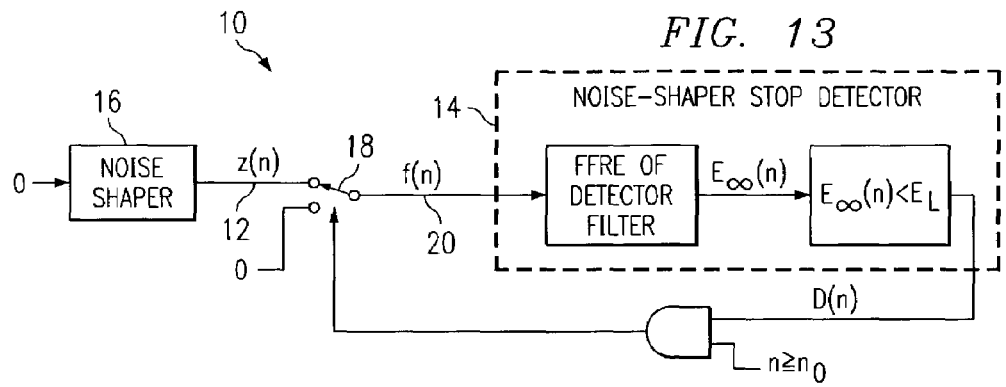
FIG. 13 is a block diagram illustrating a system for synchronized stop of a noise-shaped signal f(n)

In view of the foregoing background information, FIG. 13 now illustrates a system 10 for implementing a synchronized stop of a noise-shaped signal f(n) 20 (by setting it to zero) by means of a detector 14, monitoring the noise-shaped signal 20. This system 10 has been shown by the present inventors to stop the noise-shaped signal 20 (by setting the switch 18 in a lower position) at the first sample n, where $n \geq n_0$ and $E_\infty(n) < E_L$.

Most noise-shaper designs cause the quantized output to have some stochastic properties (e.g. due to the added random dither signal or the use of chaotic noise shapers having loop filters with poles outside the unit circle). In this case, the actual stop time of the noise-shaped signal will have an influence on the inband disturbance caused from the stop transient. The FFRE of an inband filter on the noise-shaped signal indicates if it is a good time to stop the noise-shaped signal with respect to the inband disturbance. Exemplary variations in the FFRE of an inband filter were shown in FIG. 10, where the noise-shaped signal 20 is active at $n<n_0=0$ and is stopped for $n \geq n_0=0$. Naturally, a low inband disturbance is achieved if the noise-shaped signal is stopped at a sample time where the FFRE of the inband filter is low.

With continued reference now to FIG. 13, system 10 includes a detector 14 as stated herein before, for stopping a noise-shaped signal 20 at an appropriate time which reduces the inband transient in the signal f(n) 20. The value $E_L$ specifies a limit for the FFRE of a detector filter, under which it is OK to turn off the noise-shaped signal 20. This system 10 will stop the noise-shaped signal 20 at the first $n \geq n_0$ where the FFRE $E_\infty(n)$ is below the limit value $E_L$. The transfer function of the detector filter should approximate an inband filter, i.e. pass inband frequencies. However, the filter gain can be selected arbitrary, when the limit value $E_L$ is adjusted accordingly.

Detector 14 guarantees that the transient energy (seen through the detector filter) from the stop of the noise-shaped signal is lower than the limit $E_L$; but the detector also implies a delay in the stop. A reasonable trade-off must therefore be made between low inband transient energy and low stop delay. The probability density function for the stop delay is useful in making this trade-off. Principally it cannot be guaranteed that the detector 14 will stop the noise-shaped signal 20 in finite time; and therefore a timeout may be needed—depending on the application. Example 3 below describes one method for implementing a stop of a noise-shaped signal synchronized by a detector.

Figure 15:
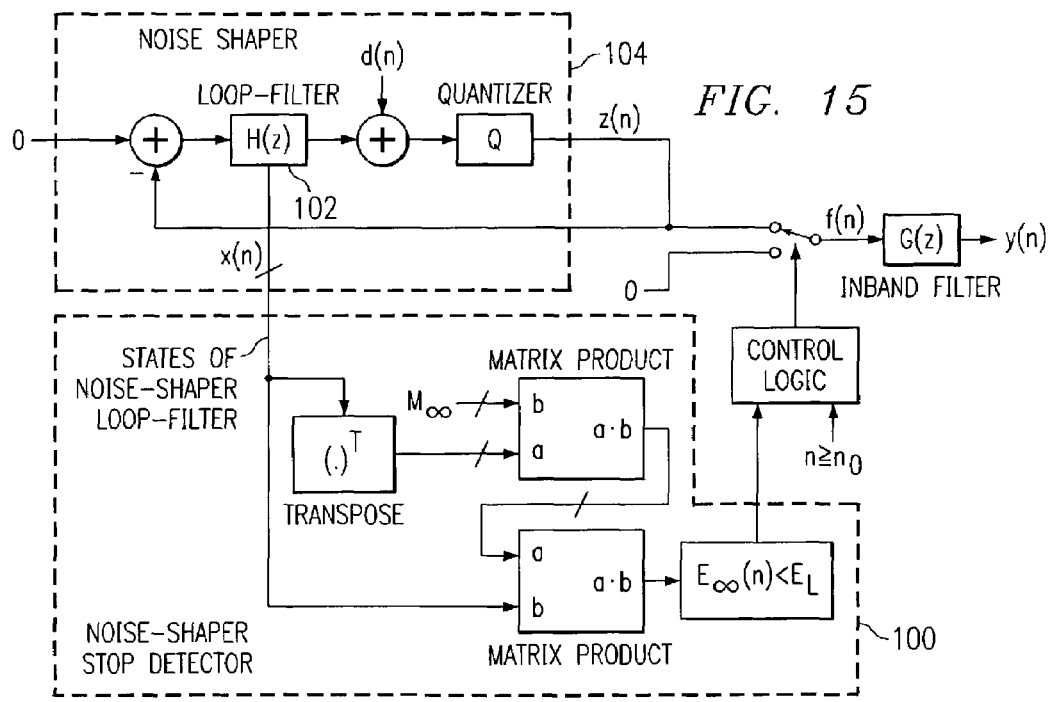
FIG. 15 is a block diagram illustrating a system for synchronized stop of a noise-shaped signal f(n), where the detector is fed with the states of the loop-filter in the noise-shaper.

An alternative detector 100 topology is shown in FIG. 15 where the internal states of a noise-shaper loop-filter 102 are used as inputs to the detector 100. In this topology, the loop-filter 102 and the detector 100 filter are partly merged in the sense that the state-space representation of the detector 100 filter uses the states from the loop-filter 102. This is possible since both the loop-filter 102 and the detector 100 filter are fed with the quantized signal z(n) when the input signal to the noise-shaper 104 is zero. Since the detector 100 filter uses the state-variables of the loop-filter 102, the transfer function of the detector 100 filter is constrained and cannot be chosen arbitrary. However, the loop-filter in a noise-shaper generally has an amplitude characteristic, which amplifies the-inband frequencies more than other frequencies, which is exactly what the detector filter should do. This means that, by this topology, a transfer function for the detector filter can be realized, which is a reasonable approximation to an ideal inband filter.

EXAMPLE 3

Noise-Shaper Stop Synchronized by a Detector

Figure 16:
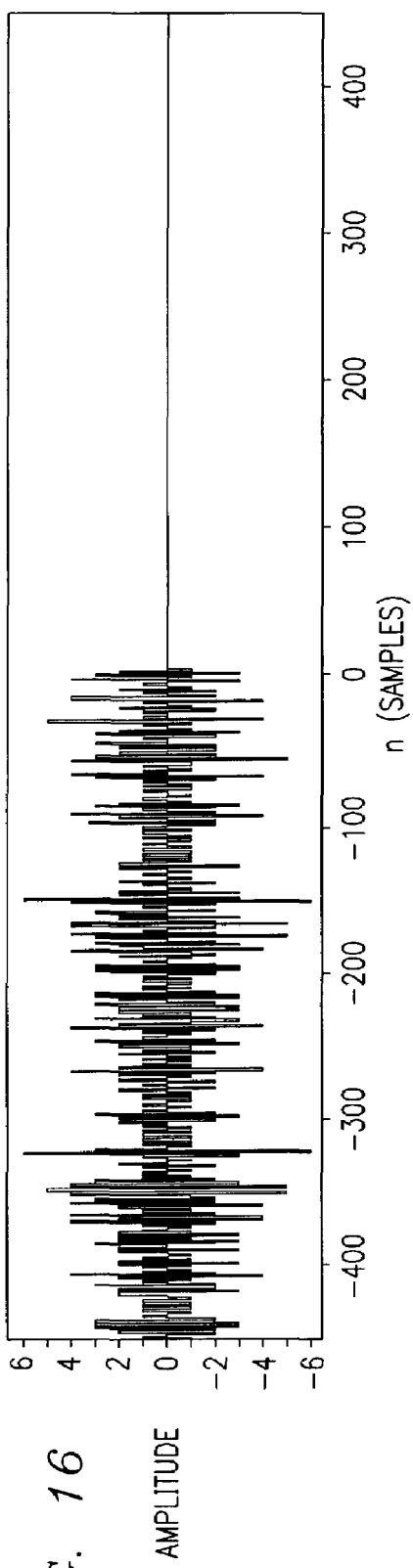
FIG. 16 is a waveform diagram illustrating the signal f(n), using a detector to control the timing of the stop of the noise-shaped signal.
Figure 17:
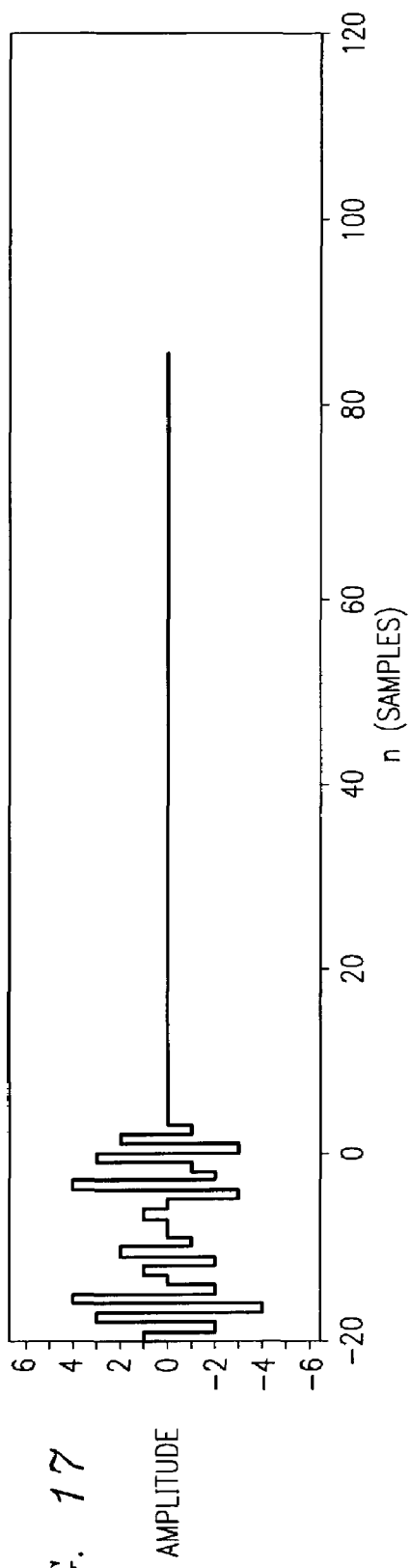
FIG. 17 is a zoomed in view of the f(n) signal waveform shown in FIG. 16.
Figure 18:
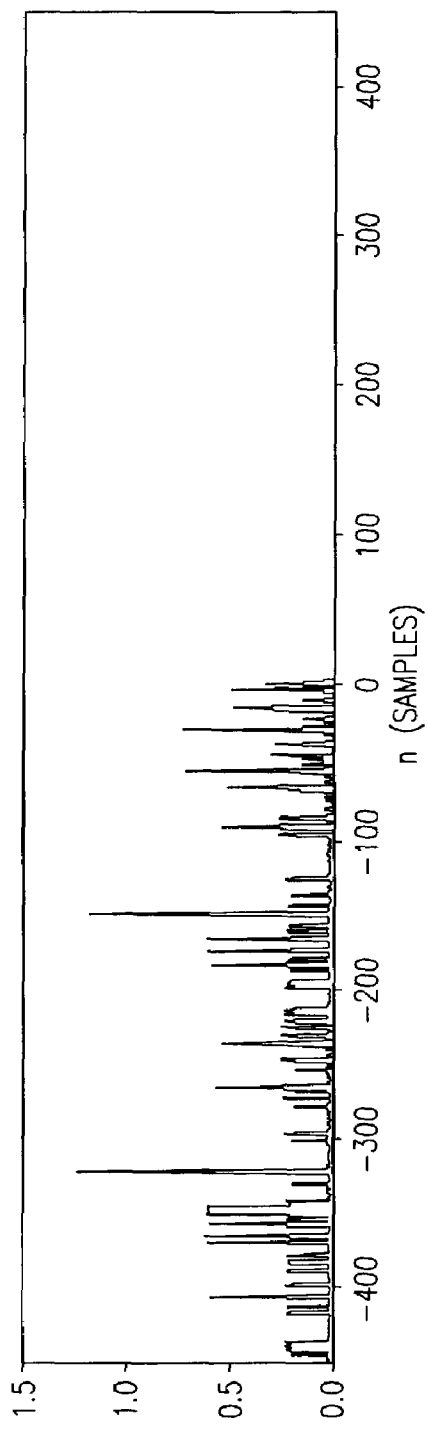
FIG. 18 is a waveform diagram illustrating the FFRE of the inband filter $E_\infty(n)$ (normalized by the sampling period) of the quantized output signal f(n) shown in FIG. 13.
Figure 19:
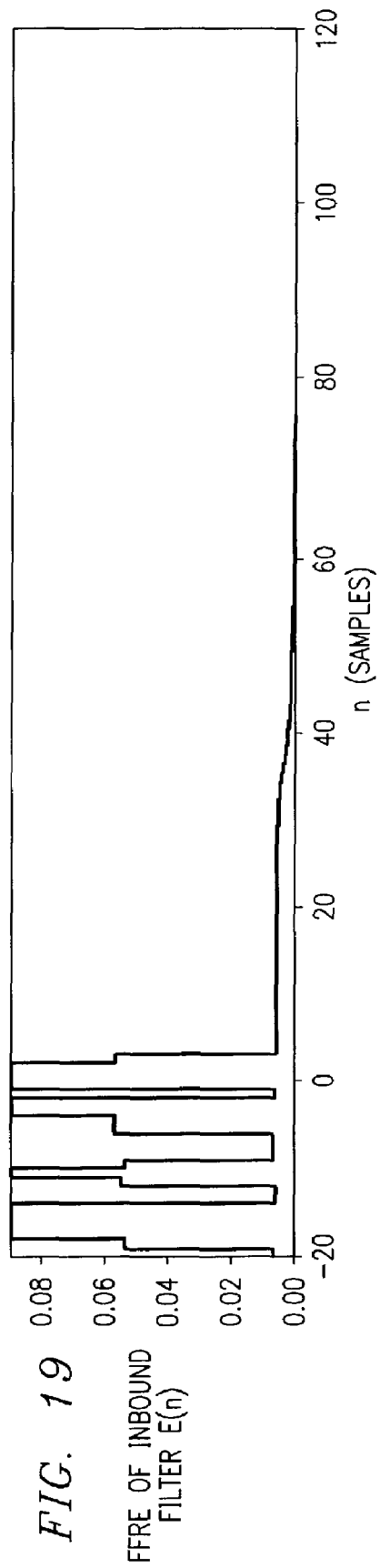
FIG. 19 is a zoomed in view of the FFRE of the inband filter $E_∞(n)$ waveform shown in FIG. 18.
Figure 20:
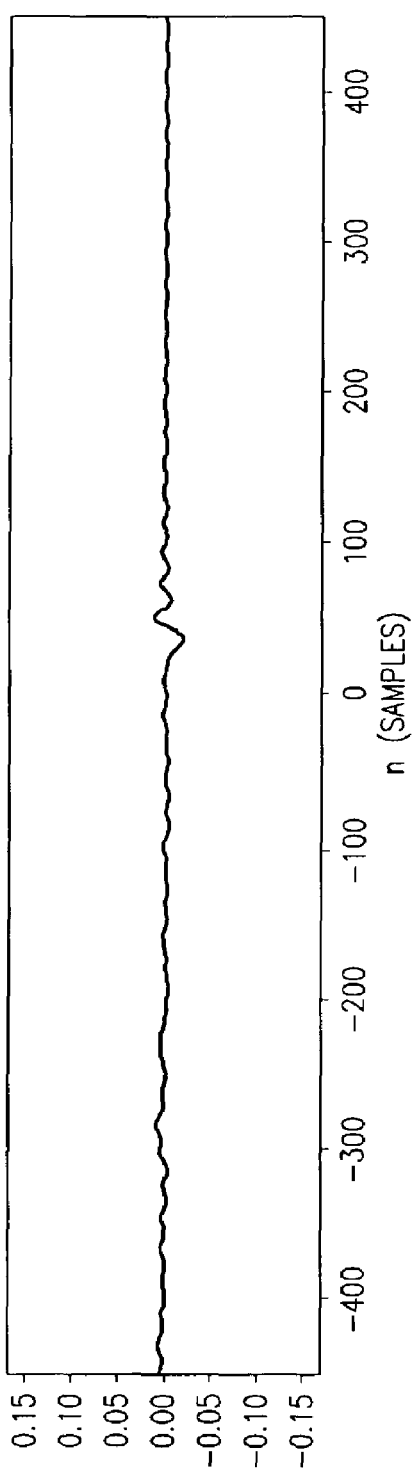
FIG. 20 is a waveform diagram illustrating the inband filtered content of f(n) shown in FIG. 13.
Figure 21:
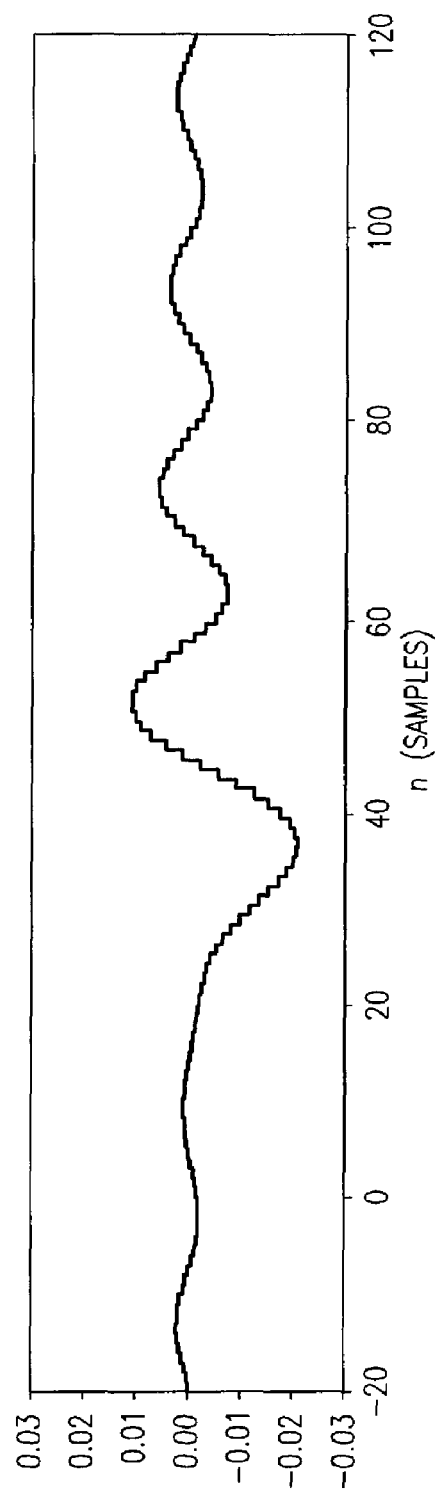
FIG. 21 is a zoomed in view of the waveform shown in FIG. 20.

The system at FIG. 13 is simulated with a detector filter identical to the inband filter from Example 2, i.e. an amplitude characteristic as shown in FIG. 3. The transient energy limit is $E_L=0.01$ and the noise-shaper stop is initiated at $n=n_0=0$. With these settings, the noise-shaped output signal f(n) looks as shown in FIG. 16 and FIG. 17. It is noted that the noise-shaped signal is stopped at n=3, which is the first sample where $n \geq n_0$ and $E_\infty(n)<E_L$. FIG. 18 and FIG. 19 show resultant plots of $E_\infty(n)$. The FFRE of the detector filter at the sample (n=3), where the noise-shaped signal is stopped, is $E_\infty(3)=0.0058$, corresponding to the energy of the inband transient shown in FIG. 20 and FIG. 21 for $n \geq 3$. A significant reduction of the inband transient is seen by a comparison of FIG. 20 and FIG. 8.

Figure 22:
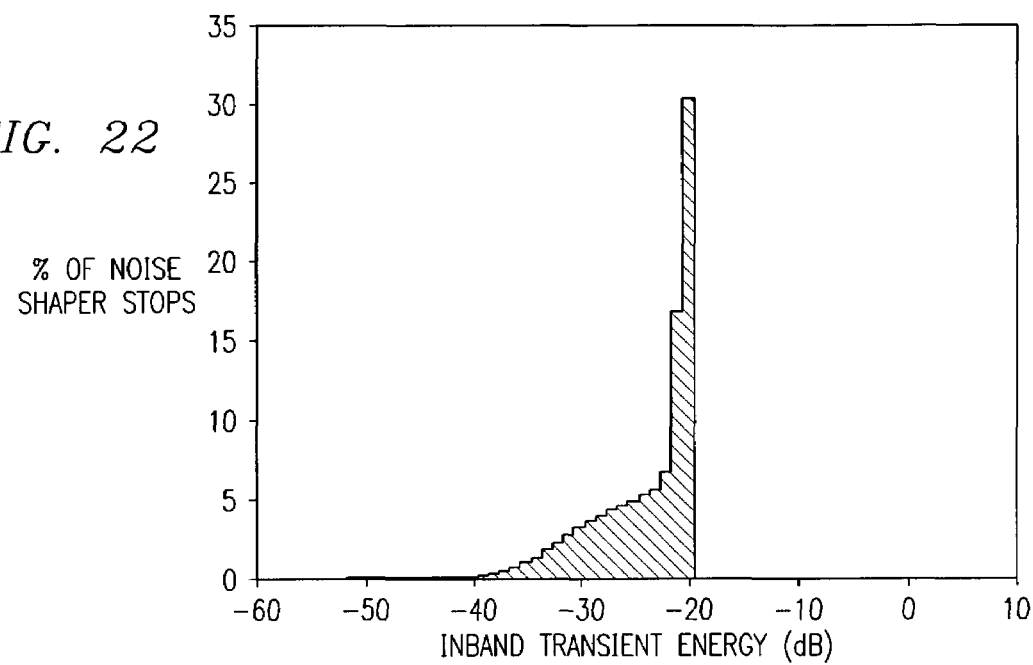
FIG. 22 is a histogram showing the distribution of the inband transient energy of f(n) for detector controlled stops of the noise-shaped signal, associated with the architecture shown in FIG. 13.
Figure 23:
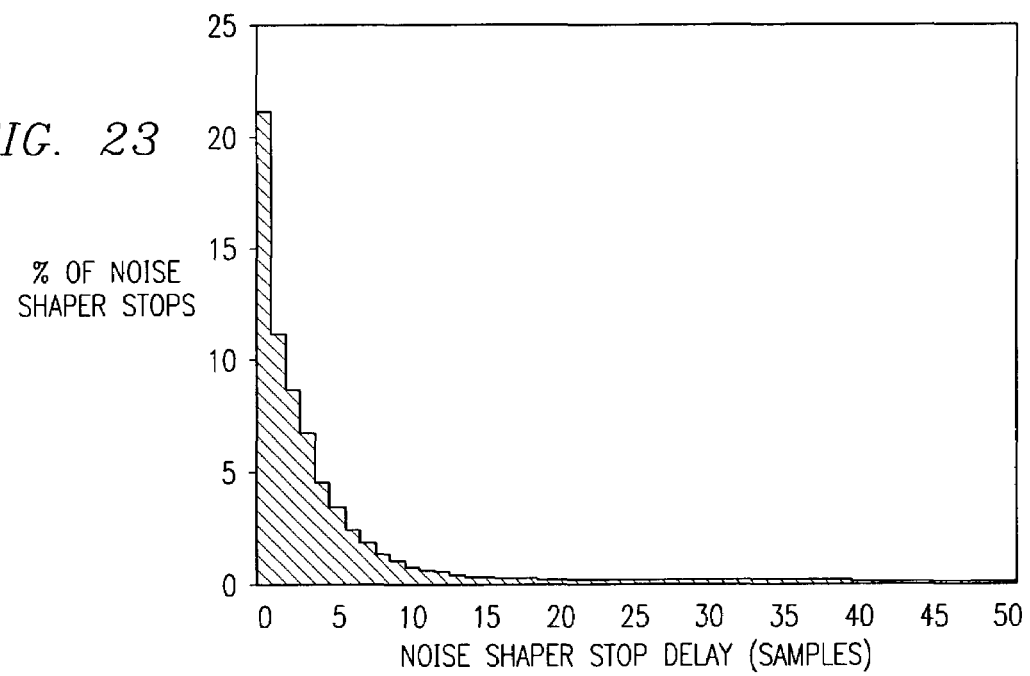
FIG. 23 is a probability distribution of the delay in stops of the noise-shaped signal due to the detector architecture shown in FIG. 13.

FIG. 22 is a histogram showing the distribution of the inband transient energy corresponding to $4 \cdot 10^6$ noise-shaper stops for this system 10 using the parameters discussed herein above. The mean value of the inband transient energies (before mapping to the dB scale) was found to be −22.4 dB. It is noted that all of the noise-shaper stops causes an inband transient energy lower than −20 dB. The probability distribution of the noise-shaper stop delay due to the detector is shown in FIG. 23. The present inventors found the delay to be smaller than 463 samples in 95% of the stops of the noise-shaped signal, and to be smaller than 1276 samples in 99.9% of the stops.

EXAMPLE 4

Noise-Shaper Stop Synchronized by a Simple Detector

Figure 14:
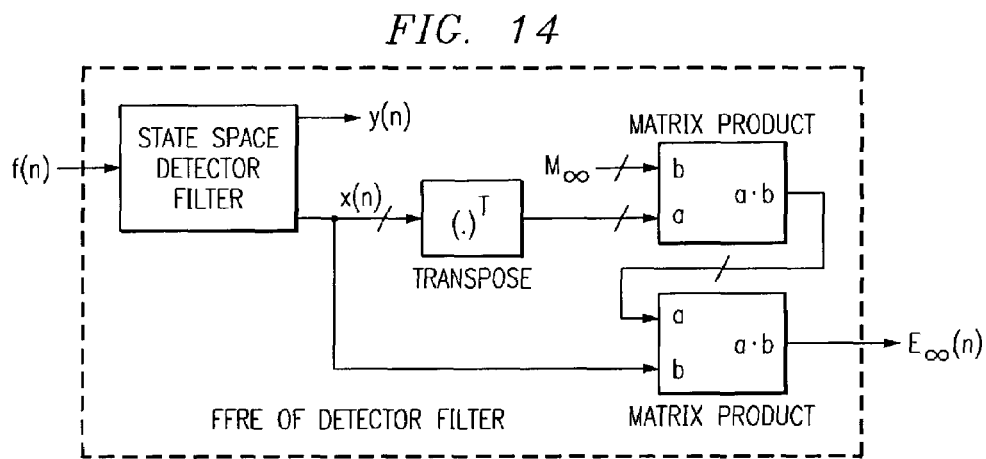
FIG. 14 is a block diagram illustrating the calculation of the FFRE of the detector filter.
Figure 24A:
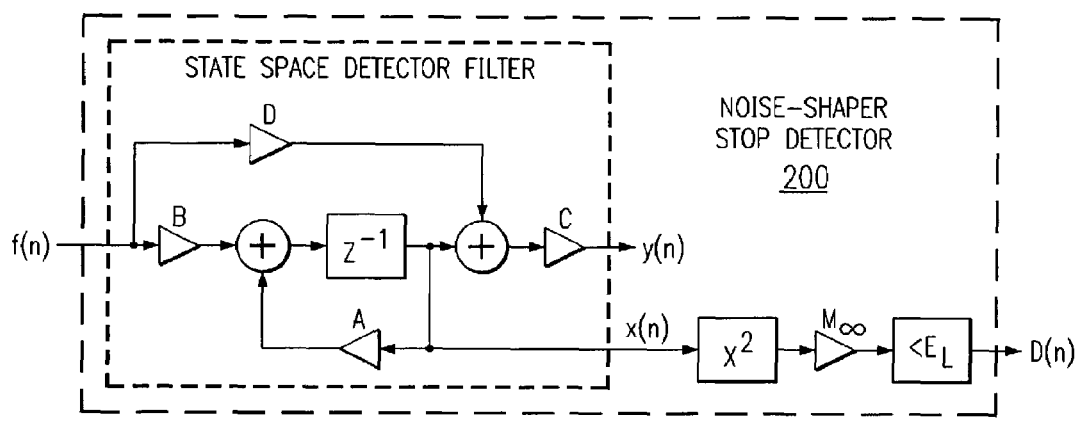
FIG. 24(*a*) is a block diagram illustrating a detector for synchronized stop of a noise-shaped signal f(n), where the detector filter is of first order.
Figure 24B:
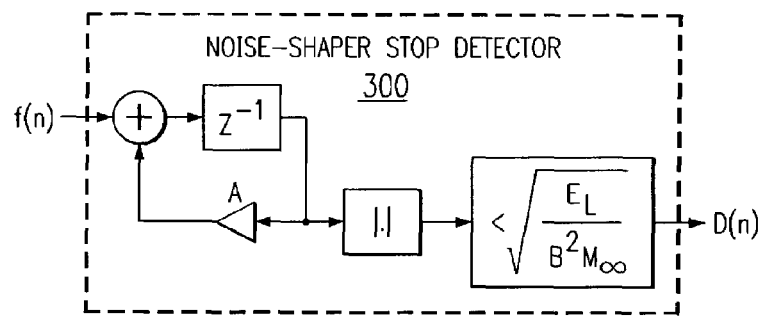

In Example 3 was used a $10^{th}$ order detector filter which was a close approximation to an ideal inband filter. However, a simple detector filter can be made using only a first order filter, which causes the state-space filter parameters A, b, c and d to be single-dimensioned scalars. In FIG. 24(a) is shown a detector 200 topology, which follows directly from FIG. 13 and FIG. 14, where FIG. 13 is a block diagram illustrating a system for synchronized stop of a noise-shaped signal f(n); and FIG. 14 is a block diagram illustrating the calculation of the FFRE of the detector filter shown in FIG. 13. The topology can be reduced in complexity by rearranging the elements, and for a first order detector filter, the topology can be reduced to the noise-shaper stop detector 300 shown in FIG. 24(b) without changing the functionality. It is seen that the detector 300 in FIG. 24(b) is simple to implement in hardware, and only requires a minimum of added circuitry.

Figure 25:
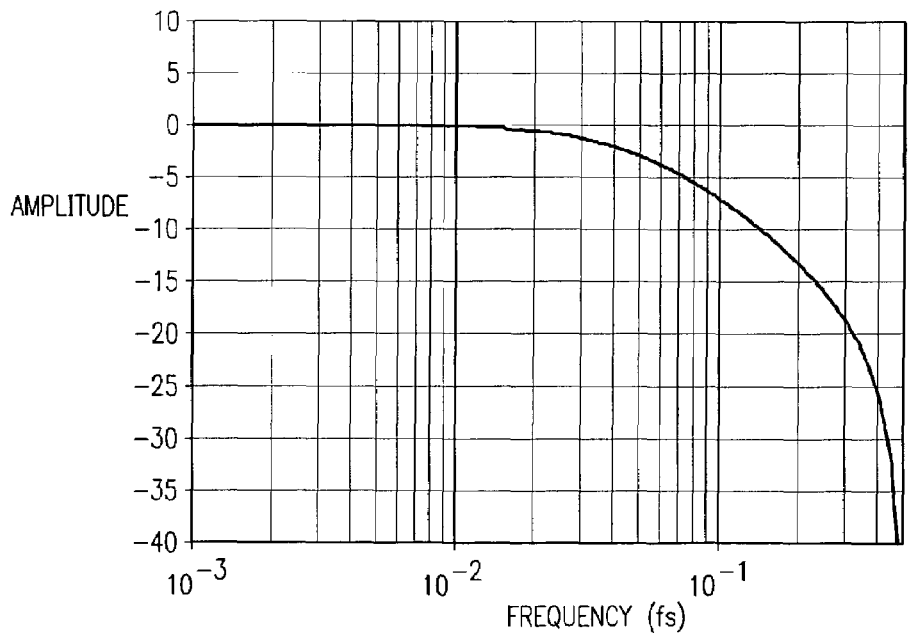
FIG. 25 is a plot diagram illustrating the amplitude characteristic of the simple detector filter realizing a $1^{st}$ order transfer function with a −3 dB frequency at ½₀ of the sampling frequency.
Figure 26:
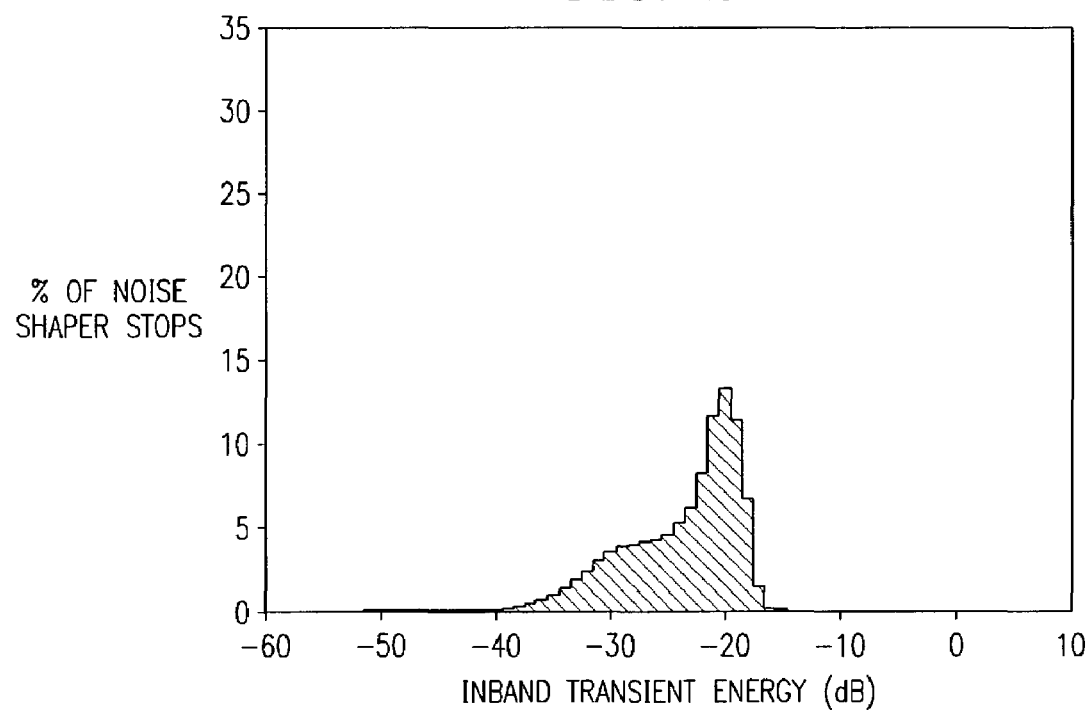
FIG. 26 is a histogram showing the distribution of the inband transient energy of f(n) for stops of the noise-shaped signal, controlled by the simple detector corresponding to architecture shown in FIG. 24(*b*)

In order to evaluate the performance of the simple detector 300, a number of stops of the noise-shaped signal are simulated on the same noise-shaper as used herein before. The detector filter has a first order low-pass characteristic with a −3 dB frequency at $\frac{1}{20}$ of the sampling frequency as shown in FIG. 25. The value of the transient energy limit $E_L$ is chosen such that 95% of the noise-shaper stops have a delay smaller than 463 samples, corresponding to the detector in Example 3. This implies $E_L=0.00525$. Using these parameters, the distribution of the inband transient energy becomes as shown in FIG. 26. The mean value of the inband transient energies (before mapping to the dB scale) was found to be −22.4 dB.

Figure 27:
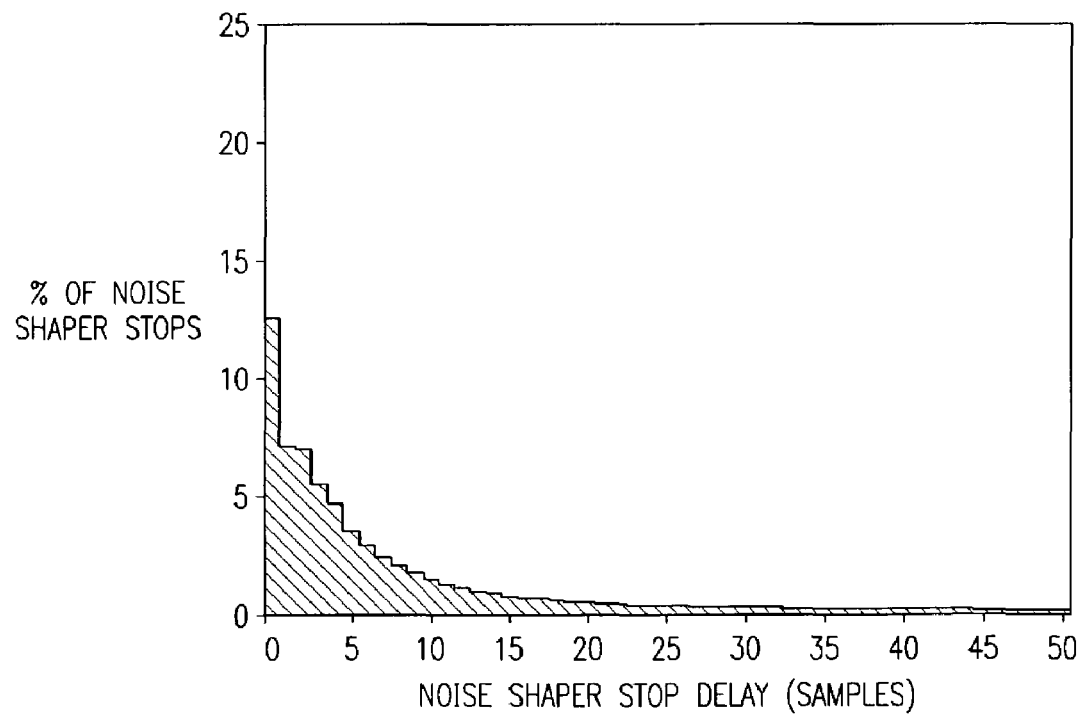
FIG. 27 is a probability distribution of the delay in stops of the noise-shaped signal due to the simple detector architecture shown in FIG. 24(*b*).

In FIG. 27 is shown the distribution of the stop delay caused by the simple detector 300. The present inventors found the delay to be smaller than 463 samples in 95% of the stops of the noise-shaped signal, and to be smaller than 1368 samples in 99.9% of the stops.

In summary explanation, a method is described for stopping a quantized signal from a noise-shaper with a significantly reduced inband transient, compared to a traditional random stop of a noise-shaped signal. The method stops the noise-shaped signal at a favorable time controlled by a detector, that monitors the noise-shaped signal—or the states of the internal loop-filter in the noise-shaper. The detector indicates the presence of a good time to stop the noise-shaped signal; and when indicated, the noise-shaped signal can selectively be stopped—resulting in a small inband transient and a correspondingly small inband disturbance.

When evaluating the efficiency of an inband transient reduction system, the statistics needs to be compared, with- and without the inband transient reduction system enabled, e.g. the reference is the inband transient energy, when the traditional way to stop a noise-shaped signal is used. The detector in Example 3 was shown to provide a mean reduction of 13.5 dB in the inband transient energy level caused by the stop of the noise-shaped signal.

This invention has been described in considerable detail in order to provide those skilled in the art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims, which follow.

What is claimed is:

1. A method of stopping transmission of a quantized signal from a noise-shaper, the method comprising the steps of:

feeding a quantized signal from a noise-shaper to a filter;

monitoring a Boolean function that is responsive to the state variables x of the filter; and stopping transmission of the quantized signal from the noise-shaper to the filter only at a time where the Boolean function is true such that a switching transient occurring when the quantized output signal transmission is stopped is minimized to substantially reduce inband disturbance.

2. A method of stopping transmission of a quantized signal from a noise-shaper, the method comprising the steps of:

feeding a quantized signal from a noise-shaper to a filter;

monitoring a Boolean function that is responsive to the state variables x of the filter; and stopping transmission of the quantized signal from the noise-shaper to the filter only at a time where the Boolean function is true such that a switching transient occurring when the quantized output signal transmission is stopped is minimized to substantially reduce inband disturbance, wherein the Boolean function is defined by a quadratic matrix M and a limit-value L such that the Boolean function is true only when $x^T Mx < L$.

3. A system for stopping a quantized signal from a noise-shaper comprising:

a filter which receives a quantized signal from a noise-shaper;

a circuit configured to generate a Boolean output signal in response to the state variables of the filter;

at least one combinatorial element configured to generate a stop signal in response to the Boolean output signal; and a switch configured to control the input to the filter in response to the stop signal.

4. The system according to claim 3 wherein the at least one combinatorial element is further configured to generate the stop signal in response to a desired sample number.

5. The system according to claim 3 wherein the Boolean output signal is defined by a Boolean function of the state variables x of the filter.

6. The system according to claim 5 wherein the Boolean function is defined by a quadratic matrix M and a limit-value L such that the Boolean function is true only when $x^T Mx < L$.

* * * * *